(12) United States Patent
Chuang et al.

(10) Patent No.: US 8,884,405 B2
(45) Date of Patent: Nov. 11, 2014

(54) PASSIVATION SCHEME

(75) Inventors: Cheng-Chi Chuang, New Taipei (TW);
Kun-Ming Huang, Taipei (TW);
Hsuan-Hui Hung, Changhua (TW);
Ming-Yi Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 196 days.

(21) Appl. No.: 13/539,160

(22) Filed: Jun. 29, 2012

(65) Prior Publication Data
US 2014/0001607 A1    Jan. 2, 2014

(51) Int. Cl.
*H01L 23/58* (2006.01)

(52) U.S. Cl.
USPC ........... 257/626; 257/637; 257/645; 257/651; 257/E23.137; 438/743; 438/744

(58) Field of Classification Search
CPC ............ H01L 51/5253; H01L 51/5256; H01L 51/5259
USPC ............... 257/626, 637, 645, 651, E23.137; 438/743, 744
See application file for complete search history.

(56) References Cited

U.S. PATENT DOCUMENTS

| | | | |
|---|---|---|---|
| 7,221,039 B2 * | 5/2007 | Huang et al. | 257/646 |
| 8,008,208 B2 * | 8/2011 | Stewart et al. | 438/711 |
| 8,564,104 B2 * | 10/2013 | Sun et al. | 257/632 |
| 2002/0163062 A1 * | 11/2002 | Wang et al. | 257/641 |
| 2011/0303280 A1 * | 12/2011 | Pawlak et al. | 136/256 |

* cited by examiner

*Primary Examiner* — Minh-Loan T Tran
(74) *Attorney, Agent, or Firm* — Lowe, Hauptman & Ham, LLP

(57) ABSTRACT

An integrated circuit includes a substrate and passivation layers. The passivation layers include a bottom dielectric layer formed over the substrate for passivation, a doped dielectric layer formed over the bottom dielectric layer for passivation, and a top dielectric layer formed over the doped dielectric layer for passivation.

20 Claims, 2 Drawing Sheets

PASSIVATION SCHEME

TECHNICAL FIELD

The present disclosure relates generally to an integrated circuit and more particularly a passivation scheme.

BACKGROUND

A passivation film (or layer) deactivates chemically and electrically active broken bonds at a semiconductor surface by reacting with selected elements; e.g. hydrogen or oxide grown on Si surface. Some integrated circuit devices have a passivation film over metal layers.

Integrated circuits including the passivation film are put under product qualification tests such as High Temperature Reverse Bias (HTRB) and/or Pressure Cooker Test (PCT). HTRB testing is an accelerated life-test for integrated circuit devices that is often used to verify the robustness of the devices themselves and the reliability of assembly and packaging of the integrated circuit devices. PCT tests water/moisture resistance at test conditions of high temperature and high pressure.

With some passivation films, mobile ions from molding compound are driven into the passivation films, and moisture can be ionized between the molding compound and the passivation film under HTRB test. These ions cannot be easily neutralized if the passivation film is a good insulator. These mobile ions can degrade the breakdown voltage (BV) of the devices.

BRIEF DESCRIPTION OF THE DRAWINGS

Reference is now made to the following descriptions taken in conjunction with the accompanying drawings, in which.

DETAILED DESCRIPTION

Figure 1:
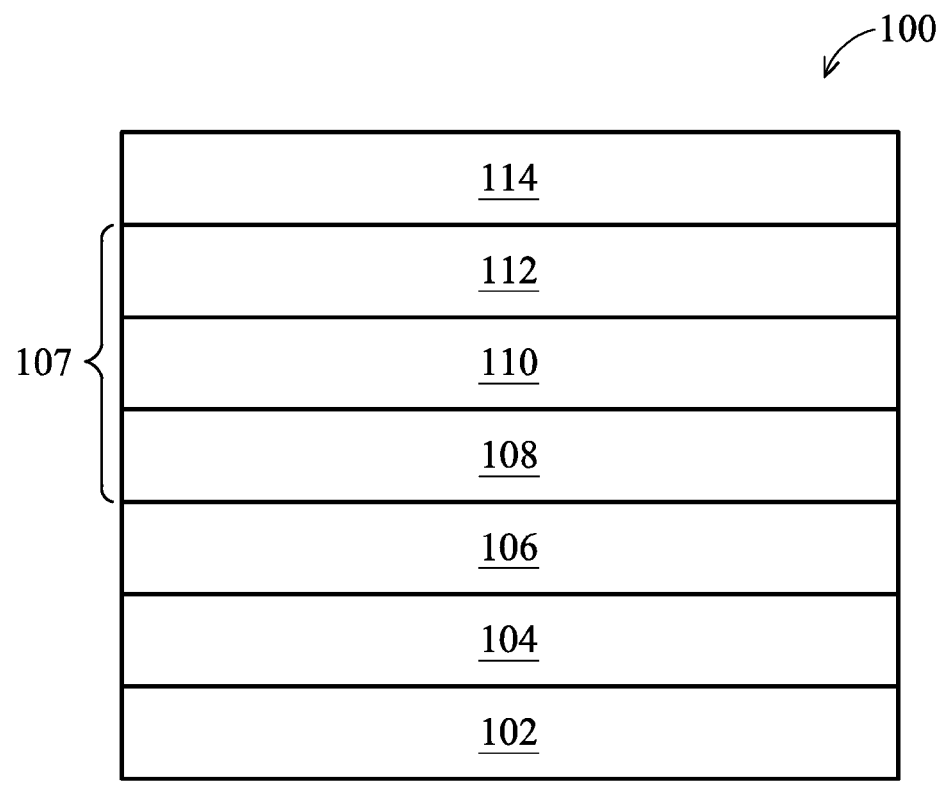
FIG. 1 is a cross-sectional view of an integrated circuit with an exemplary passivation scheme according to some embodiments.

The making and using of various embodiments are discussed in detail below. It should be appreciated, however, that the present disclosure provides many applicable inventive concepts that can be embodied in a wide variety of specific contexts. The specific embodiments discussed are illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a cross-sectional view of a portion of an integrated circuit 100 with an exemplary passivation scheme according to some embodiments. The integrated circuit 100 includes a substrate 102, a dielectric layer 104, a metal layer 106, passivation layers 107, and a molding compound layer 114. The substrate 102 comprises silicon, germanium, gallium arsenide, indium phosphide, silicon carbide, Silicon-On-Insulator (SOI), or any other suitable material. Electrical components such as transistors, resistors, any other devices can be formed on the substrate 102 by any suitable methods known in the art in some embodiments.

The dielectric layer 104 comprises silicon dioxide ($SiO_2$), silicon nitride (e.g., $Si_3N_4$), high-k dielectric (e.g., $HfO_2$), low-k dielectric, or any other suitable material. The dielectric layer 104 can be inter metal dielectric (IMD) or inter layer dielectric (ILD) in some embodiments. The metal layer 106 comprises Al, Cu, Sn, Ni, Au, Ag, or other suitable material, and can be deposited using electroplating, physical vapor deposition (PVD), or any other suitable process. The metal layer 106 is used for electrical interconnects or contacts, for example.

The passivation layers 107 include a bottom dielectric layer 108, a doped-dielectric layer 110, and a top dielectric layer 112. The bottom dielectric layer 108 comprises oxide ($SiO_2$), for example. The bottom dielectric layer 108 is not doped in some embodiments. The bottom dielectric layer 108 has a thickness ranging from 2000 Å to 3000 Å in some embodiments and can be deposited using chemical vapor deposition (CVD), for example.

The doped dielectric layer 110 comprises oxide ($SiO_2$) with 3%-8% dopants such as phosphorus and/or boron in some embodiments (weight percentage). In one example, 4%-8% phosphorus and 3%-5% boron are added (weight percentage). In some other embodiments, other dopants can be used instead of phosphorus or boron. The doped dielectric layer 110 has a thickness ranging from 5000 Å to 7000 Å in some embodiments. The doped dielectric layer 110 can be deposited with TEOS (Tetraethyl Orthosilicate) using sub-atmospheric pressure chemical vapor deposition (SACVD), for example. With even higher doping, HTRB stress test results may be affected unfavorably in some applications.

The top dielectric layer 112 comprises silicon nitride (e.g., $Si_3N_4$) or polyimide, for example. The top dielectric layer 112 is not doped in some embodiments. The top dielectric layer 112 is selected for good performance of water resistance under PCT in some embodiments. The top dielectric layer 112 has a thickness ranging from 2000 Å to 3000 Å in some embodiments and can be deposited with silane using chemical vapor deposition (CVD), for example. The thicknesses of the bottom dielectric layer 108, the doped dielectric layer 110, and the top dielectric layer 112 can be modified for different devices and applications.

Even though the bottom dielectric layer 108, the doped dielectric layer 110, and the top dielectric layer 112 are formed directly adjacent to the next layer as shown in FIG. 1, there can be one or more intervening layers in between the three dielectric layers in some other embodiments.

The molding compound layer 114 comprises polymer such as epoxy or any other suitable molding compound material. The molding compound layer 114 can be formed, e.g., by an injection molding process or hot embossing process.

The passivation layers 107 improve device electric field distribution and performances under HTRB and PCT tests. The top dielectric layer 112, e.g., $Si_3N_4$, protects integrated circuits formed on the substrate 102 from water. The doped dielectric layer 110, e.g., oxide (SiO$_2$) doped with phosphorus and/or boron (e.g., deposited with PTEOS or BPTEOS), provides a path for mobile ions moving from the molding compound layer 114. The mobile ions are distributed relatively uniformly along the doped dielectric layer 110, which prevents local concentration of mobile ions. This prevents mobile ions gathering at device locations such as a drain site and a source site which may build local electric field and deteriorate the integrated circuit functions.

For some exemplary integrated circuits using the passivation layers 107 in FIG. 1, the BV under HTRB test was increased about 50 V from about 850 V to about 900 V after 168 hours under stress. In comparison, conventional integrated circuits without using the passivation layers 107 in FIG. 1 showed reduced BV from about 850 V to about 700 V under the same test. The integrated circuits using the passivation layers 107 also showed good performance after 96 hours under PCT.

Figure 2:
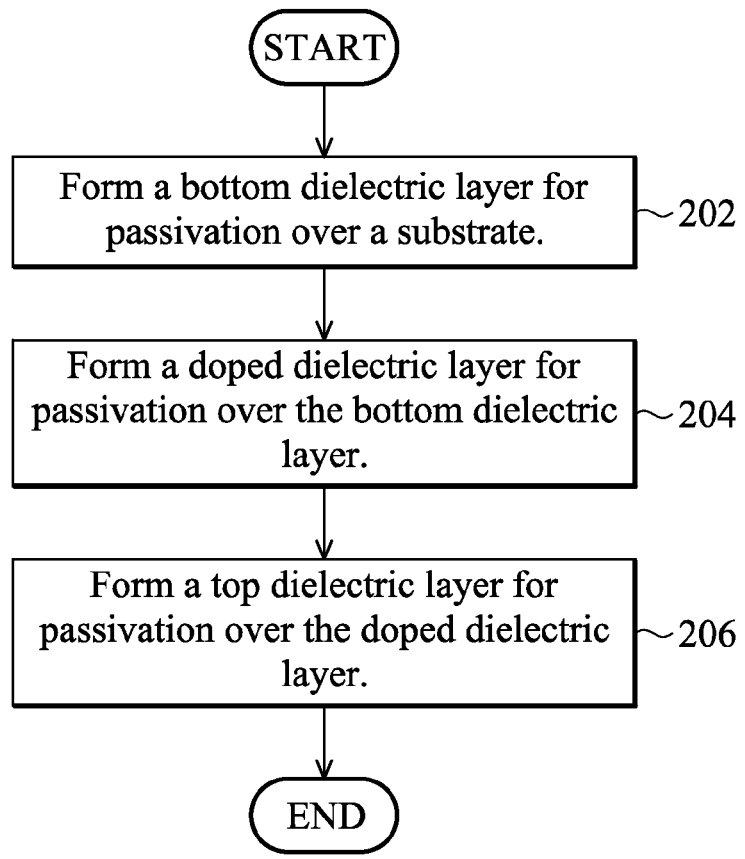
FIG. 2 is a flowchart of a method for forming a passivation scheme in the integrated circuit 100 in FIG. 1 according to some embodiments.

FIG. 2 is a flowchart of a method for forming a passivation scheme in the integrated circuit 100 in FIG. 1 according to some embodiments. At step 202, a bottom dielectric layer 108, e.g., oxide (SiO$_2$), is formed over a substrate 102 for passivation. The bottom dielectric layer 108 is not doped in some embodiments. The bottom dielectric layer 108 has a thickness ranging from 2000 Å to 3000 Å in some embodiments and can be deposited using chemical vapor deposition (CVD), for example.

At step 204, a doped dielectric layer 110, e.g., phosphorus and/or boron doped oxide (SiO$_2$), is formed over the bottom dielectric layer 108. The doped dielectric layer 110 comprises oxide (SiO$_2$) with 3%-8% dopants such as phosphorus and/or boron in some embodiments. In other embodiments, other dopants can be used instead of phosphorus or boron. The doped dielectric layer 110 has a thickness ranging from 5000 Å to 7000 Å in some embodiments. The doped dielectric layer 110 can be deposited with TEOS using sub-atmospheric pressure chemical vapor deposition (SACVD), for example.

At step 206, a top dielectric layer 112, e.g., silicon nitride (such as Si$_3$N$_4$) or polyimide, is formed over the doped dielectric layer 110. The top dielectric layer 112 is not doped in some embodiments. The top dielectric layer 112 is selected for better performance of water resistance under PCT in some embodiments. The top dielectric layer 112 has a thickness ranging from 2000 Å to 3000 Å in some embodiments and can be deposited with silane using chemical vapor deposition (CVD), for example. The thicknesses of the bottom dielectric layer 108, the doped dielectric layer 110, and the top dielectric layer 112 can be modified for different devices and applications.

According to some embodiments, an integrated circuit includes a substrate and passivation layers. The passivation layers include a bottom dielectric layer formed over the substrate for passivation, a doped dielectric layer formed over the bottom dielectric layer for passivation, and a top dielectric layer formed over the doped dielectric layer for passivation.

According to some embodiments, a method includes forming a bottom dielectric layer for passivation over a substrate. A doped dielectric layer is formed for passivation over the bottom dielectric layer. A top dielectric layer is formed for passivation over the doped dielectric layer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit, comprising:
    a substrate; and
    passivation layers including:
        a bottom dielectric layer formed over the substrate;
        a doped dielectric layer formed over the bottom dielectric layer; and
        a top dielectric layer formed over the doped dielectric layer.

2. The integrated circuit of claim 1, wherein the doped dielectric layer is doped with phosphorus, boron, or both.

3. The integrated circuit of claim 1, wherein the doped dielectric layer is doped with dopants ranging from 3% to 8%.

4. The integrated circuit of claim 1, wherein the doped dielectric layer has a thickness ranging from 5000 Å to 7000 Å.

5. The integrated circuit of claim 1, wherein the bottom dielectric layer comprises SiO$_2$.

6. The integrated circuit of claim 1, wherein the bottom dielectric layer has a thickness ranging from 2000 Å to 3000 Å.

7. The integrated circuit of claim 1, wherein the top dielectric layer comprises silicon nitride or polyimide.

8. The integrated circuit of claim 1, wherein the top dielectric layer has a thickness ranging from 2000 Å to 3000 Å.

9. The integrated circuit of claim 1, further comprising a metal layer formed between the substrate and the bottom dielectric layer.

10. The integrated circuit of claim 1, further comprising a molding compound layer formed over the top dielectric layer.

11. A method, comprising
    forming a bottom dielectric layer for passivation over a substrate;
    forming a doped dielectric layer for passivation over the bottom dielectric layer; and
    forming a top dielectric layer for passivation over the doped dielectric layer.

12. The method of claim 11, wherein the doped dielectric layer is doped with phosphorus, boron, or both.

13. The method of claim 11, wherein the doped dielectric layer is doped with dopants ranging from 3% to 8%.

14. The method of claim 11, wherein the doped dielectric layer is formed by sub-atmospheric pressure chemical vapor deposition (SACVD).

15. The method of claim 11, wherein the bottom dielectric layer comprises SiO$_2$.

16. The method of claim 11, wherein the bottom dielectric layer is formed by chemical vapor deposition (CVD).

17. The method of claim 11, wherein the top dielectric layer comprises silicon nitride or polyimide.

18. The method of claim 11, wherein the top dielectric layer is formed by chemical vapor deposition (CVD).

19. The method of claim 11, further comprising:
   forming a metal layer over the substrate prior to forming the bottom dielectric layer;
   forming a molding compound layer over the top dielectric layer.

20. An integrated circuit, comprising:
   a substrate;
   a metal layer formed over the substrate;
   passivation layers including:
      a bottom dielectric layer formed over the metal layer;
      a doped dielectric layer formed over the bottom dielectric layer; and
      a top dielectric layer formed over the doped dielectric layer; and
   a molding compound layer formed over the top dielectric layer.

* * * * *